(12) United States Patent
Fuchigami et al.

(10) Patent No.: US 9,252,360 B2
(45) Date of Patent: **\*Feb. 2, 2016**

(54) ALD PROCESSING TECHNIQUES FOR FORMING NON-VOLATILE RESISTIVE SWITCHING MEMORIES

(71) Applicant: Intermolecular Inc., San Jose, CA (US)

(72) Inventors: Nobumichi Fuchigami, Sunnyvale, CA (US); Pragati Kumar, Beaverton, OR (US); Prashant B Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/467,902

(22) Filed: Aug. 25, 2014

(65) Prior Publication Data

US 2014/0361236 A1  Dec. 11, 2014

Related U.S. Application Data

(63) Continuation of application No. 14/091,594, filed on Nov. 27, 2013, now Pat. No. 8,847,190, which is a continuation of application No. 13/911,929, filed on Jun. 6, 2013, now Pat. No. 8,623,671, which is a continuation of application No. 13/184,335, filed on Jul. 15, 2011, now Pat. No. 8,481,338, which is a continuation of application No. 12/478,680, filed on Jun. 4, 2009, now Pat. No. 8,008,096.

(60) Provisional application No. 61/059,038, filed on Jun. 5, 2008.

(51) Int. Cl.
*H01L 21/00* (2006.01)
*H01L 45/00* (2006.01)
*H01L 27/24* (2006.01)

(52) U.S. Cl.
CPC .......... *H01L 45/146* (2013.01); *H01L 27/2463* (2013.01); *H01L 45/08* (2013.01); *H01L 45/10* (2013.01); *H01L 45/1233* (2013.01); *H01L 45/1253* (2013.01); *H01L 45/1616* (2013.01); *H01L 27/2409* (2013.01)

(58) Field of Classification Search
CPC ............ H01L 27/2463; H01L 27/2472; H01L 27/2481; H01L 27/249; H01L 45/1233
USPC .............. 257/4, 295, E27.006; 365/458, 158; 438/3
See application file for complete search history.

(56) References Cited

U.S. PATENT DOCUMENTS

| 8,847,198 B2 * | 9/2014 | Basceri et al. .................. 257/13 |
| 2004/0159867 A1 * | 8/2004 | Kinney et al. ................. 257/295 |
| 2007/0159869 A1 * | 7/2007 | Baek et al. ..................... 365/148 |

* cited by examiner

Primary Examiner — Brook Kebede

(57) ABSTRACT

ALD processing techniques for forming non-volatile resistive-switching memories are described. In one embodiment, a method includes forming a first electrode on a substrate, maintaining a pedestal temperature for an atomic layer deposition (ALD) process of less than 100° Celsius, forming at least one metal oxide layer over the first electrode, wherein the forming the at least one metal oxide layer is performed using the ALD process using a purge duration of less than 20 seconds, and forming a second electrode over the at least one metal oxide layer.

19 Claims, 9 Drawing Sheets

ALD PROCESSING TECHNIQUES FOR FORMING NON-VOLATILE RESISTIVE SWITCHING MEMORIES

CROSS-REFERENCE TO RELATED APPLICATIONS

This application is a continuation claiming priority to U.S. patent application Ser. No. 14/091,594 filed 27 Nov. 2013, which is itself a continuation claiming priority to U.S. patent application Ser. No. 13/911,929 filed 6 Jun. 2013, which is itself a continuation of U.S. patent application Ser. No. 13/184,335 filed 15 Jul. 2011 and issued as U.S. Pat. No. 8,481,338, which is itself a continuation of U.S. patent application Ser. No. 12/478,680 filed 4 Jun. 2009 and issued as U.S. Pat. No. 8,008,096, which claims priority under 35 U.S.C. §119 to U.S. Prov. Pat. App. Ser. No. 61/059,038 filed 5 Jun. 2008, all of which are incorporated herein by reference for all purposes.

FIELD OF THE INVENTION

The present invention relates generally to electronic memories. More specifically, ALD processing techniques for forming non-volatile resistive-switching memories are described.

BACKGROUND OF THE INVENTION

Nonvolatile memories are semiconductor type memories that retain their contents when unpowered. Nonvolatile memories are used for storage in electronic devices such as digital cameras, cellular telephones, and music players, as well as in general computer systems, embedded systems and other electronic devices that require persistent storage. Nonvolatile semiconductor memories can take the form of removable and easily transportable memory cards or other memory modules, can be integrated into other types of circuits or devices, or can take any other desired form. Nonvolatile semiconductor memories are becoming more prevalent because of their advantages of being small and persistent, having no moving parts, and requiring little power to operate.

Flash memory is a common type of nonvolatile memory used in a variety of devices. Flash memory is a transistor-based memory device that uses multiple gates per transistor and quantum tunneling to store the contents of a memory cell. Flash memory uses a block-access architecture that can result in long access, erase, and writing times.

The speeds of electronic devices and the storage demands of users are rapidly increasing. Flash memory is proving to be inadequate for nonvolatile memory needs. Additionally, volatile memories (such as random access memory (RAM)) can potentially be replaced by nonvolatile memories if the speeds of nonvolatile memories are increased to meet the requirements for RAM and other currently volatile memories.

Thus, what is needed is a new type of nonvolatile memory. Memories that include elements which exhibit changes in resistive states in response to the application of voltages have been described. These memories typically have operational and durability limitations. Therefore, a resistive-switching memory with improved operational and durability characteristics is desired.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, resistive-switching memory elements can be formed that use resistive-switching metal oxide layers. According to some of these embodiments, a metal-insulator-metal (MIM) memory element can be formed from two electrodes and one or more layers of one or more metal oxides disposed therebetween. In some embodiments, metal oxide layers can be formed using atomic layer deposition (ALD). Certain ALD process parameters can be optimized to reduce the forming voltage and increase the site yield of memory elements described herein. For example, the purge duration and the substrate temperature of the deposition process can be optimized.

I. Memory Structure

Figure 1:
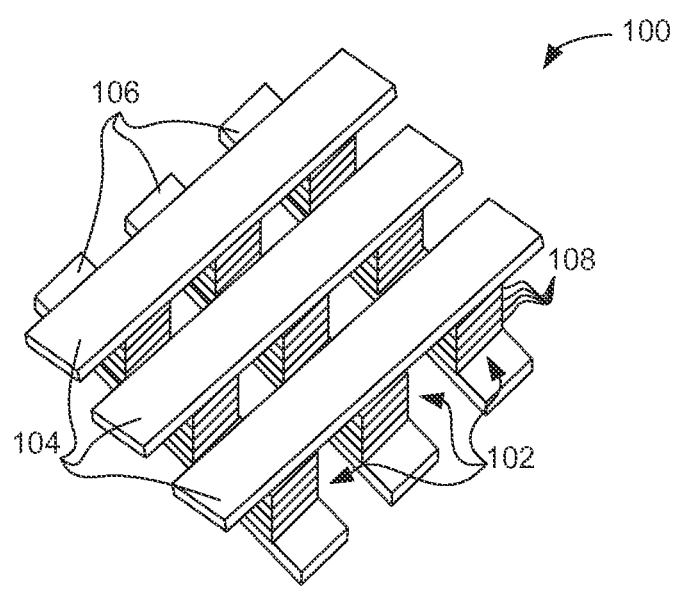
FIG. 1 illustrates a memory array of resistive switching memory elements.

FIG. 1 illustrates a memory array 100 of resistive switching memory elements 102. Memory array 100 may be part of a memory device or other integrated circuit. Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a nonvolatile memory device from resistive switching memory elements such as element 102. For example, horizontal and vertical lines 104 and 106 may be connected directly to the terminals of resistive switching memory elements 102. This is merely illustrative.

Figure 4:
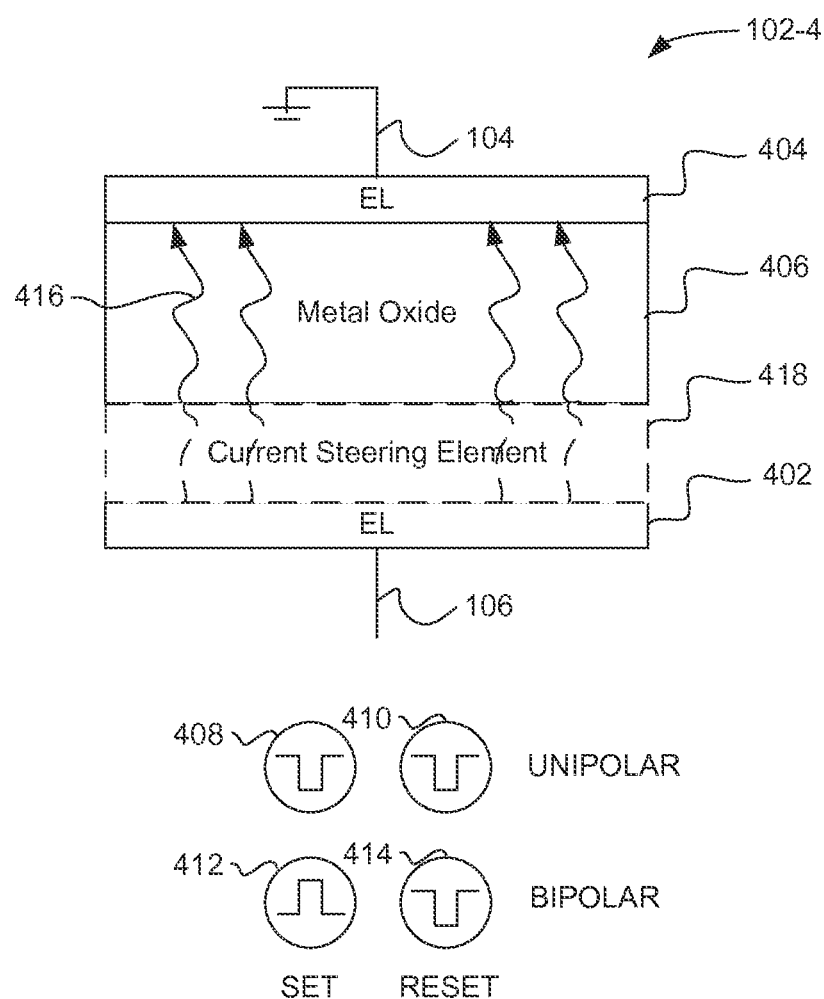
FIG. 4 illustrates an exemplary memory element according to various embodiments.

If desired, other electrical devices may be associated (i.e., be one or more of the layers 108) with each memory element 102 (see, e.g., FIG. 4). These devices, which are sometimes referred to as current steering elements, may include, for example, diodes, p-i-n diodes, silicon diodes, silicon p-i-n diodes, transistors, etc. Current steering elements may be connected in series in any suitable locations in memory element 102.

II. Memory Operation

During a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of signal lines 104 and 106.

Figure 2A:
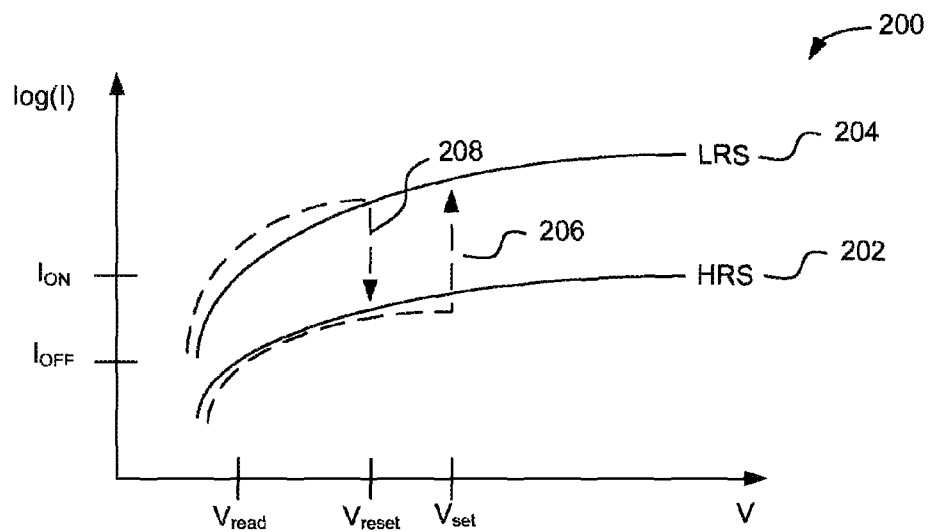
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, the change in the resistive state of memory element 102 may be because of the filling of traps (i.e., a may be "trap-mediated") in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses (see FIG. 4) can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102. A lower forming voltage may be desirable (e.g. less than 5 volts) to reduce the likelihood of damage to the memory element. As is described herein, certain process techniques can be used to form memory elements that have lower forming voltages.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is nonvolatile. As can be appreciated, it is desirable for memory element 102 to have a large difference between off current and on current (i.e., a high $I_{ON}/I_{OFF}$ ratio), which causes the on and off states of the memory element to be more discrete and easily detectable.

III. Switching Mechanisms

A. Bulk-Mediated Switching

In its most basic form, the layers 108 of the memory element 102 include two electrodes (each having one or more materials and/or layers) and one or more layers of one or more metal oxides disposed in between. The memory element 102 generally has a metal-insulator-metal (MIM) capacitor structure, although other structures such as metal-insulator-insulator-metal (MIIM) and metal-insulator-insulator-insulator-metal (MIIIM) can be used as described herein.

Without being bound by theory, in some embodiments the memory element 102 may use a switching mechanism that is mediated in the bulk of the metal oxide. Generally, defects are formed in, already exist in the deposited metal oxide, and existing defects can be enhanced by additional processes. Defects may take the form of variances in charge in the structure of the metal oxide. For example, some charge carriers may be absent from the structure (i.e., vacancies) or additional charge carriers may be present (i.e., interstitials). Therefore, by applying a voltage to the memory element 102, the defects, such as traps, can either be filled or emptied to alter the resistivity of a metal oxide and resistive switching memory elements can be formed using these principles.

In some embodiments, and for some materials, the set voltage is dependent on the thickness of the metal oxide layer (see discussion regarding FIGS. 3A-3C) which indicates a bulk-mediated switching mechanism.

The metal oxides may be of any phase, including crystalline and amorphous. The deposited metal oxides can have impurities (i.e., substitional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

Figure 2B:
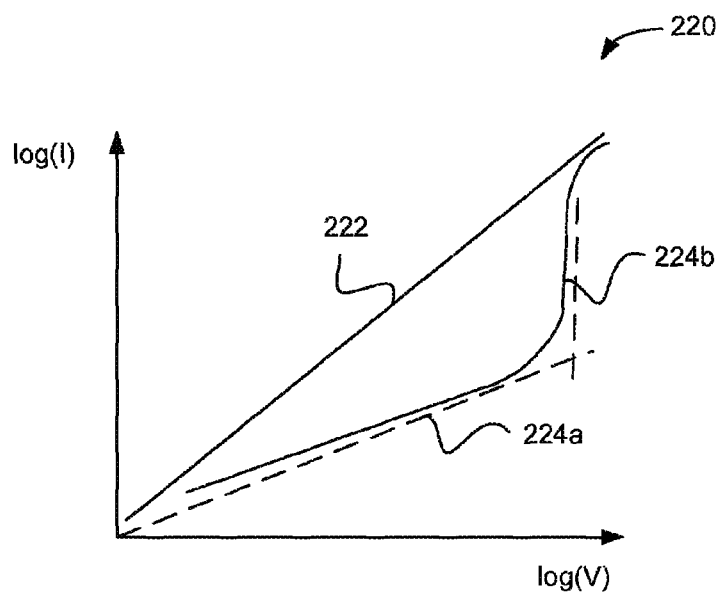
FIG. 2B is a logarithm of current (I) versus logarithm voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt graph like graph 224 is desired. The graph 224 begins with an Ohmic response 224a, and then curves sharply upward 224b. The graph 224 may represent a set operation, where the memory element 102 switches from the HRS 202 to the LRS 204.

Without being bound by theory, non-metallic percolation paths are formed during a set operation and broken during a reset operation. For example, during a set operation, the memory element 102 switches to a low resistance state. The percolation paths that are formed by filling traps increase the conductivity of the metal oxide, thereby reducing (i.e., changing) the resistivity. The voltage represented by 224b is the set voltage. At the set voltage, the traps are filled and there is a large jump in current as the resistivity of the metal oxide decreases.

The set voltage shown here is very discrete (i.e., vertical), which is desirable to ensure the switching of the memory element occurs at a repeatable voltage. Additionally, a high ratio of on current to off current (i.e., a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and forming voltages in order to avoid damage to the memory elements and to be compatible with complementary device elements (see FIG. 4) such as diodes and/or transistors in series with the memory element 102.

B. Defects

The metal oxide includes electrically active defects (also known as traps) in the bulk. It is believed that the traps can be filled by the application of the set voltage, and emptied by applying the reset voltage. Traps can be inherent in the metal oxide (i.e., existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer.

A metal oxide may include defects that are the result of the process used to form the metal oxide. In other words, the defects may be inherent in the metal oxide. For example, atomic layer deposition (ALD) processes deposit layers that will always have some imperfections or flaws. These imperfections can generally be referred to as defects in the structure of the metal oxide. The defects can be used to create localized charge variances that can be filled and emptied by applying voltage pulses to the metal oxides. Defects can be created by doping, which is explained in more detail below.

C. Scaling and Bandgap

Figure 3A:
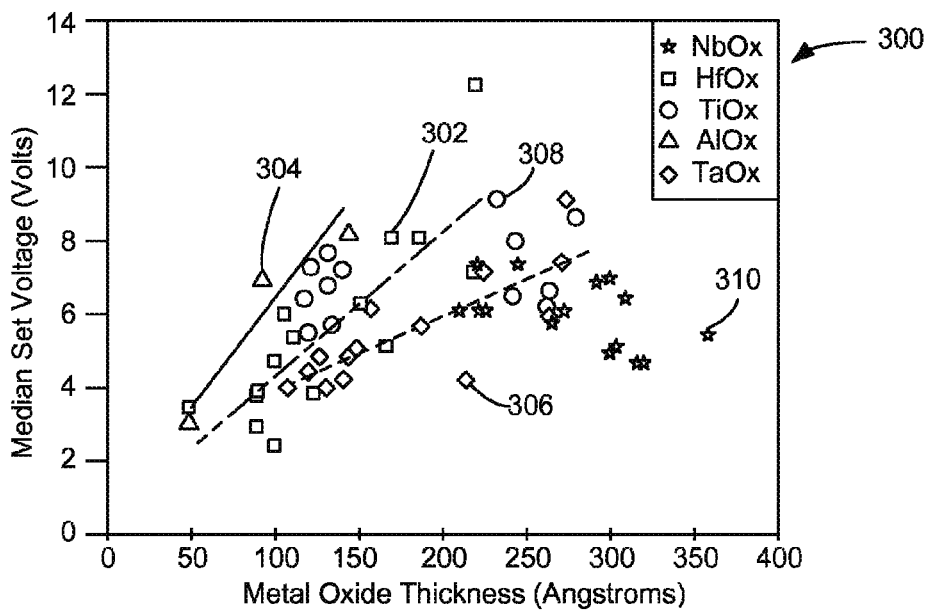
FIGS. 3A-3C are graphs showing the relationship between thickness of a metal oxide layer and set voltage, reset voltage, and on/off current ratios for several materials systems used in memory elements described herein.
Figure 3B:
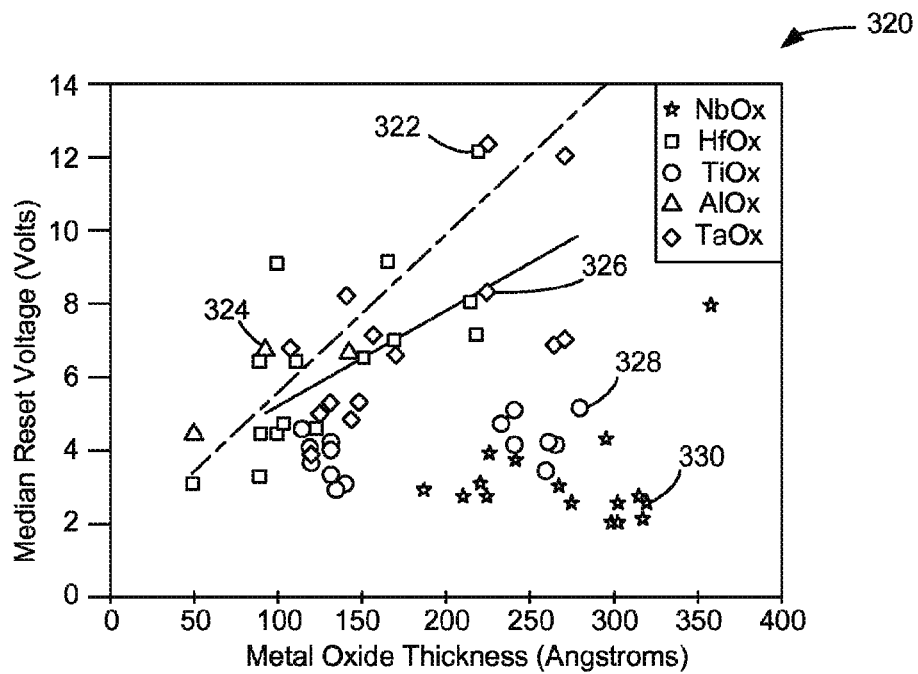
Figure 3C:
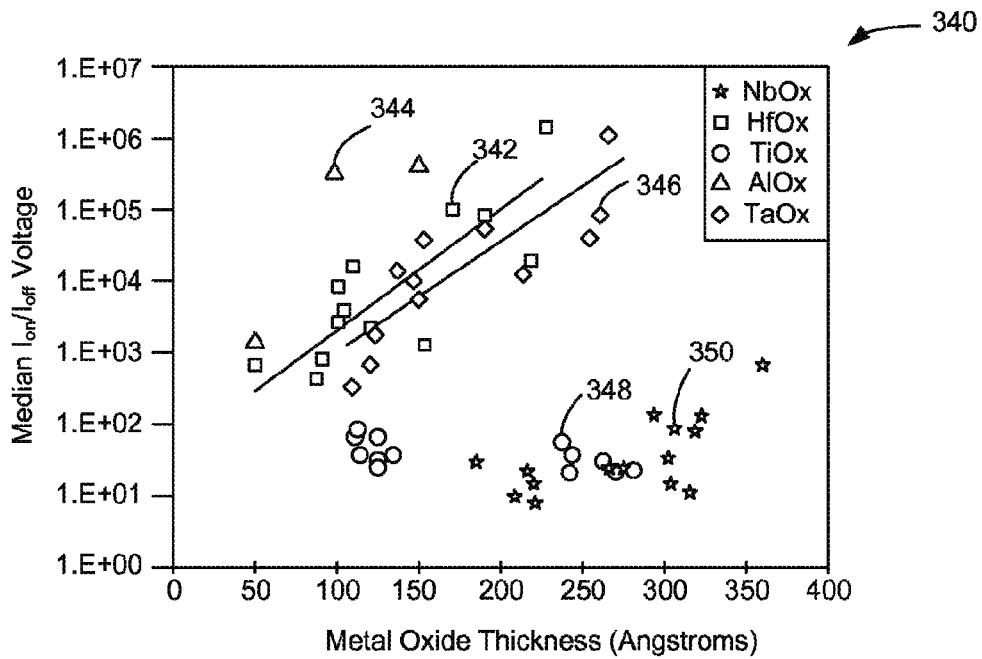

FIGS. 3A-3C are graphs showing the relationship between thicknesses of a metal oxide layer and resulting set voltages, reset voltages, and on/off current ratios for several materials systems used in memory elements described herein. These graphs describe a system that includes two electrodes and a single layer of metal oxide disposed in between. As can be seen in FIG. 3A, for hafnium oxide 302, aluminum oxide 304, and tantalum oxide 306, set voltage increases with (i.e., is dependent on) thickness, and in some embodiments and for these materials the set voltage is at least one volt (V) per one hundred angstroms (Å) of the thickness of a metal oxide layer in the memory element. In some embodiments, an increase in the thickness of the metal oxide layer of 100 Å increases the set voltage by at least 1V. Similarly, as shown in FIG. 3B, reset voltage for hafnium oxide 322, aluminum oxide 324, and tantalum oxide 326 also depends on thickness. These data therefore support a bulk-controlled set/reset mechanism for these materials, since a linear relationship indicates the formation of percolation paths throughout the bulk of the metal oxide. In other words, for a thicker material, more voltage is needed to fill the traps.

Hafnium oxide (5.7 electron volts (eV)), aluminum oxide (8.4 eV) and tantalum oxide (4.6 eV) all have a bandgap greater than 4 eV, while titanium oxide (3.0 eV) and niobium oxide (3.4 eV) have bandgaps less than 4 eV. As shown in FIGS. 3A and 3B, set voltages for titanium oxide 308 and niobium oxide 310 and reset voltages for titanium oxide 328 and niobium oxide 330 do not increase with thickness. Therefore, a higher bandgap (i.e., bandgap greater than 4 eV) metal oxide exhibits bulk mediated switching and scalable set and reset voltages. In other words, set and reset voltages can be reduced by reducing the thickness of the high bandgap metal oxides such as hafnium oxide. Therefore, for smaller devices, set and reset voltages can be lowered. However, other materials, including lower bandgap materials (i.e. having a bandgap less than 4 eV) have also shown switching properties, and may be used with embodiments described herein.

FIG. 3C shows a relationship between the $I_{ON}/I_{OFF}$ ratio and the thickness of a metal oxide layer. Metal oxides that have bandgaps greater than 4 eV (i.e., hafnium oxide 342, aluminum oxide 344, and tantalum oxide 346, as well as other higher-bandgap materials such as zirconium oxide and yttrium oxide) show a scaling relationship between $I_{ON}/I_{OFF}$ ratio and thickness. Additionally, for increasing bandgap, the $I_{ON}/I_{OFF}$ ratio increases. Conversely, materials having a bandgap less than 4 eV (i.e., titanium oxide 348 and niobium oxide 350) exhibit an $I_{ON}/I_{OFF}$ ratio that is independent of oxide thickness. Additionally, the higher bandgap materials generally have higher $I_{ON}/I_{OFF}$ ratios, which improve the ability to distinguish between the off state and the on state of the memory element.

Figure 3D:
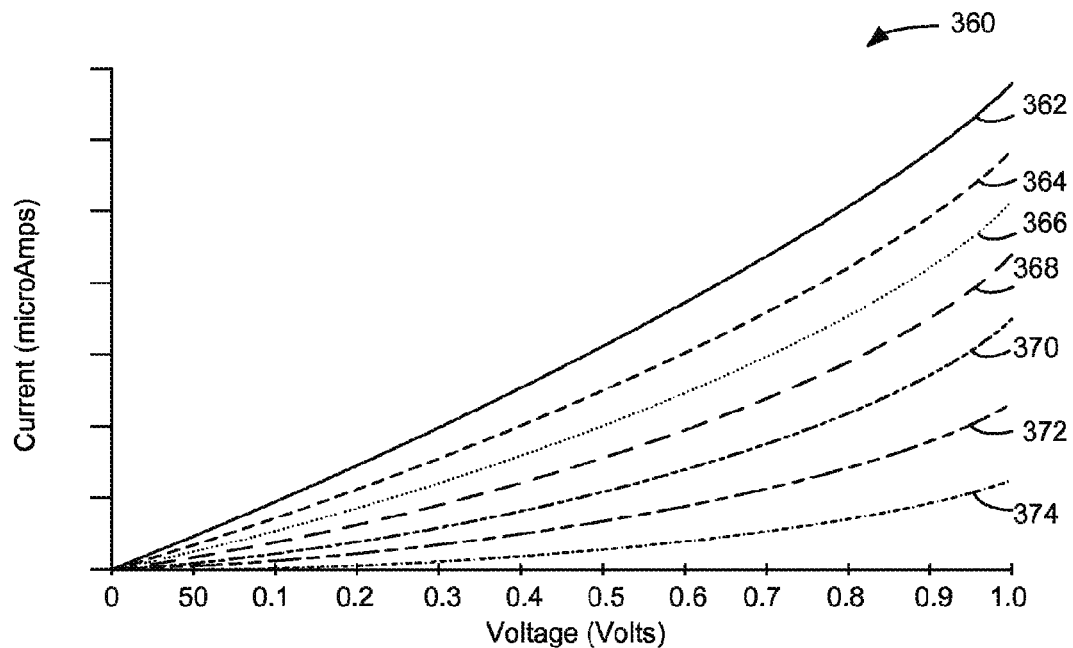
FIG. 3D is a graph that illustrates a non-metallic nature of metal oxides used for the memory elements described herein

FIG. 3D is a graph 360 that illustrates a non-metallic nature of metal oxides used for the memory elements described herein. The graph 360 shows increasing resistivity for a high-bandgap (i.e., greater than 4 eV) oxide layer with decreasing temperatures, which is a characteristic of a non-metallic material. The graph 360 shows a sweep in voltage on the x-axis versus current on the y-axis. As can be seen the measurements 362 taken at 300 Kelvin (K) show the greatest current output, and thus lowest resistivity. The measurements 364 taken at 250K, 366 taken at 150K, 368 taken at 100K, 370 taken at 60K, 372 taken at 50K, and 374 taken at 10K show increasing resistivity (i.e., lower current) as the temperature decreases. This is a characteristic of non-metallic materials; some embodiments described herein include metal oxides that exhibit non-metallic switching mechanisms.

IV. Memory Element Structures

A. Design Considerations

As described above, a desirable resistive-switching memory element in some embodiments has low set and reset voltages and a high $I_{ON}/I_{OFF}$ ratio. A materials system for achieving these goals includes a metal oxide that exhibits bulk-mediated switching and includes a base metal oxide that has a bandgap of greater than 4 electron volts (eV), although resistive-switching metal oxides can be made from other materials (e.g. titanium oxide) if desired.

Other design considerations may include using more than one metal oxide in a single layer (co-deposition) or multiple layers (stacked), using electrodes that have different work functions, using at least one noble metal electrode, using different metal oxides having different bandgaps, and using low leakage materials. The off current is related to the leakage of the material and the size of the device. Generally, the leakage should be low enough that the off current remains low enough to provide adequate separation between the on and off currents (i.e., a sufficiently high $I_{ON}/I_{OFF}$ ratio). Leakage is related to $I_{OFF}$, and the 40 A/cm$^2$ measured at 0.5 V per 20 Å of oxide thickness in an off state of the memory element described herein gives an off current that is low enough to give a reliably high $I_{ON}/I_{OFF}$ ratio.

B. Materials

1. Metal Oxides

Specific metal oxides that use bulk-mediated switching mechanisms according to embodiments of the invention include hafnium oxide, aluminum oxide, tantalum oxide, zirconium oxide, and yttrium oxide. These metal oxides have a bandgap that is greater than 4 eV, indicating that they are more insulating and therefore have a higher resistivity. As is explained regarding FIGS. 3A-3C, higher bandgap (i.e., greater than 4 eV) metal oxides also allow for scaling of set voltage as related to metal oxide thickness. However, other materials have been shown to have switching properties and may also be used with the embodiments described herein.

These oxides can be doped with each other and additionally, for example, scandium oxide, yttrium oxide, and nickel oxide. Other dopants may include rare earth metals such as lanthanum, cerium, praseodymium, neodymium, gadolinium, erbium, ytterbium, and lutetium and their oxides. Additional dopants may include hafnium, hafnium oxide, oxygen, silicon, silicon oxide, nitrogen, fluorine, chromium, and chromium oxide.

Another criterion for selecting a metal oxide can be to have a metal nitride electrode and a metal oxide adjacent to the metal nitride electrode. The metal to form the metal oxide and the metal nitride are the same. For example, a memory element can be formed having a titanium nitride electrode and a titanium oxide layer adjacent to the titanium nitride electrode. This serves to stabilize the interface, for example. The memory element can also include other metal oxides (e.g., aluminum oxide or hafnium oxide) in a stacked or co-deposited manner.

In another embodiment, two metal oxides can be stacked in layers to adjust the effective on current of the memory element 102. The first metal oxide can have a smaller on current than the second metal oxide material and the second metal oxide material can have a lower off current than the first metal oxide material. In these embodiments, the memory element 102 can have the lower off current of the second metal oxide material and the lower on current of the first metal oxide material to make the memory element 102 compatible with other device elements, for example a diode or transistor in series with the memory elements.

2. Electrodes

Electrode materials may include silicon, silicides, doped silicon (e.g. n-type or p-type polysilicon), titanium nitride (TiN), platinum, iridium, iridium oxide, ruthenium and ruthenium oxide. According to some embodiments, one electrode may be a higher work function material, and the other electrode may be a lower work function material. For example, in one embodiment, at least one electrode is a high work function material such as a noble or near noble metal (i.e., a metal with a low absolute value (i.e., negative or positive) free energy change ($|\Delta G|$) of oxide formation). Noble or near noble metals include iridium, iridium oxide, platinum, ruthenium, and ruthenium oxide. The other electrode may be a lower work function material such as titanium nitride, or may also be a noble or near noble material. In some embodiments, the reset pulse at the electrode having the higher work function is a positive pulse (i.e., the higher work function electrode is the anode of the memory element).

In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory elements in some configurations and embodiments.

C. Memory Element Structure

FIG. 4 illustrates an exemplary memory element 102-4 according to various embodiments. As is described below, various different configurations of memory element 102 are possible; the memory element 102-4 shown in FIG. 4 is one example of a memory element 102 that can be used with memory array 100.

The memory element 102-4 includes two electrodes 402 and 404. The electrodes 402 and 404 can be formed using any appropriate process, such as PVD, CVD, ALD, etc., and can have any appropriate thickness, for example 10-2000 Å.

A bottom electrode 402 is, in some embodiments, nearer a substrate on which the memory element 102-4 is formed. A top electrode 404 is further from the substrate. Although "bottom" and "top" are used to describe the electrodes for some systems, it is understood that the memory element 102-4 may have any orientation relative to the substrate, signal lines, word lines and bit lines, or other components of the memory array 100, and that the memory element 102-4 may be formed in reverse order from what is shown.

The electrodes 402 and 404 may be adjacent to or otherwise in electrical communication with signal lines 104 and 106. The signal lines 104 and 106 can be any conductor such as tungsten, aluminum, or copper.

A metal oxide 406 is between the electrodes 402 and 404. The memory element 102-4 may be described as an MIM stack. The metal oxide 406 may in some embodiments be described as a transition metal oxide, and may be a binary metal oxide, ternary metal oxide, or some other combination of the materials described above. The metal oxide is, in some embodiments, formed using atomic layer deposition (ALD). If the metal oxide is a binary or ternary metal oxide, the metal oxide 406 may be co-deposited (e.g. co-injected of formed as a nanolaminate). The electrodes 402 and 404 and the metal oxide 406 are layers 108 of the memory element 102 shown in FIG. 1.

1. Set and Reset Pulses

In some embodiments, the metal oxide 406 uses a bulk-mediated switching mechanism as described above. Various techniques for switching the memory element are described below. In one embodiment, the electrode 404 is grounded and voltage pulses are applied to the electrode 402. In a unipolar embodiment, for example, the set pulse 408 and reset pulse 410 are both negative. In a bipolar embodiment, the set pulse 412 is positive while the reset pulse 414 is negative. Alternatively, the electrode 402 is grounded and pulses are applied to the electrode 404. In the alternative embodiment, for unipolar switching, both the set and reset voltage pulses applied to the electrode 404 are positive. In the bipolar embodiment, the set voltage is negative and the reset voltage is positive.

The electrode that is positive for the reset voltage pulse is described herein as the anode. The anode is positive for reset, and may be either positive for the set (for unipolar embodiments) or negative for the set (for bipolar embodiments).

Generally, the set and reset voltages may either have a same relative polarity (unipolar) or a different relative polarity (bi-polar).

2. Percolation Paths

According to one embodiment, percolation paths 416 are believed to originate from electrode 402 and spread toward electrode 404. With the memory elements 102, the anode is the electrode at which the reset pulse is positive (i.e., the electrode 404). In the memory elements 102, the percolation paths 416 originate from the cathode and, as traps are filled, migrate toward the anode in the presence of the set voltage pulse 408 or 412. The reset pulse 410 subsequently destroys the percolation paths 416. In some embodiments, oxygen ($O^{2-}$) defects may be the mobile species that lead to the formation of the percolation paths. Although percolation paths are described here, it is understood that other mechanisms can be used to explain the switching mechanism of the memory element.

3. Current Steering Element

The memory element 102-4 (as well as other memory elements 102 described herein) can include an optional complementary device such as a current steering element 418. The current steering element 418 is in series with the memory element 102, and may be, for example, a diode or transistor. The current steering element 418 can be located anywhere with respect to memory element 102 (e.g., between the metal oxide 406 and the electrode 404).

V. Memory Element Formation

Figure 5:
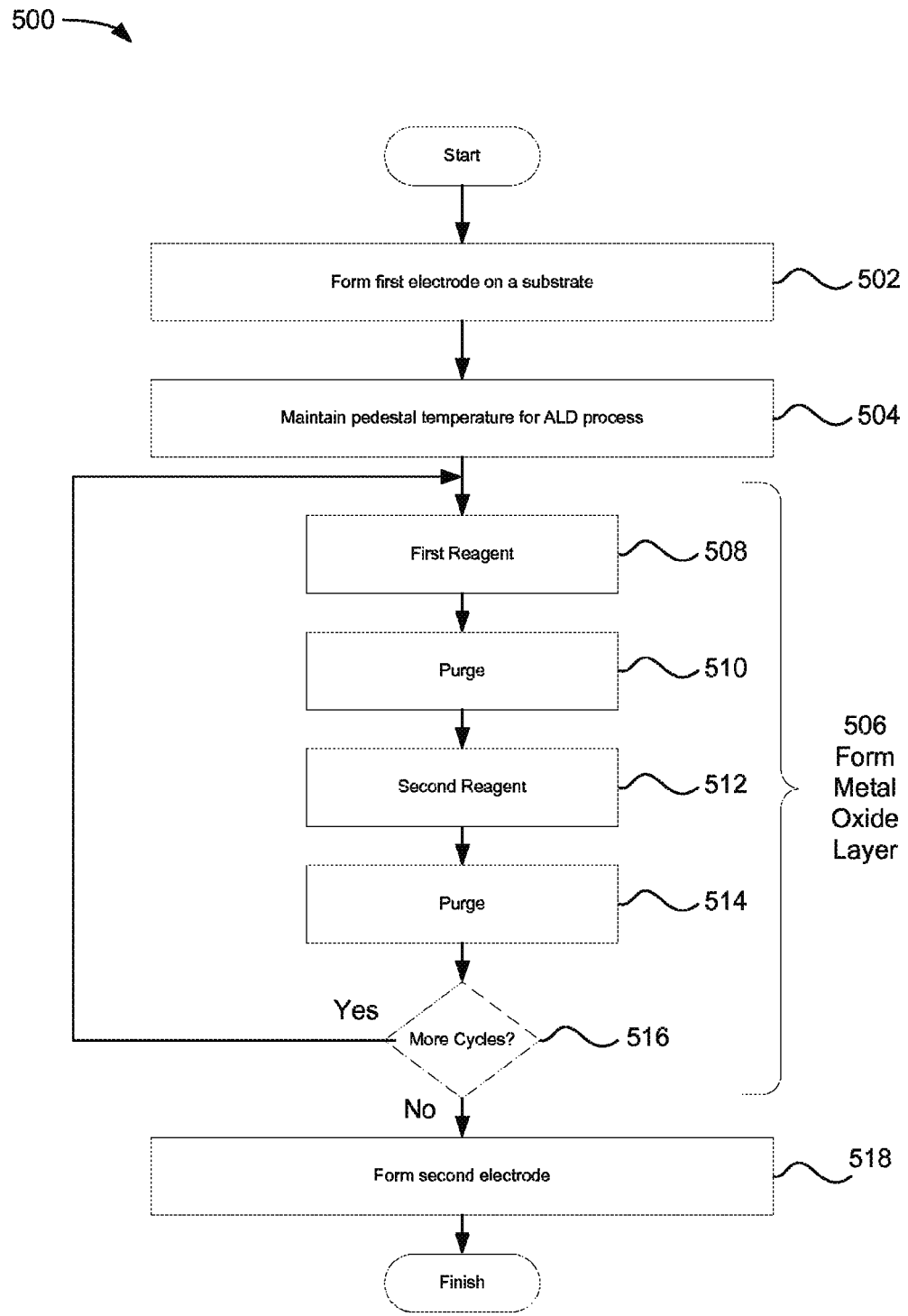
FIG. 5 is a flowchart describing a process for forming a memory element.

FIG. 5 is a flowchart describing a process 500 for forming a memory element. The process 500 is a general description of techniques used to form the memory elements described above. The process 500 describes techniques for forming a memory element 102 generally including two electrodes and at least one layer of metal oxide disposed therebetween. Although certain processing techniques and specifications are described, it is understood that various other techniques and modifications of the techniques described herein may also be used.

In operation 502, a first electrode is formed. The first electrode can be formed on a substrate, for example, a silicon substrate that may include one or more layers already formed thereon. The first electrode may be formed over a signal line such as a bit line or a word line. The first electrode can be silicon, a silicide, titanium nitride, or other appropriate materials such as those described above. In one example, a titanium nitride electrode is formed using PVD or another process described above. For example, the first electrode can be sputtered by bombarding a metal target at 150-500 W with a pressure of 2-10 mTorr for a deposition rate of approximately 0.5-5 Å/s. These specifications are given as examples; the specifications can vary greatly depending on the material to be deposited, the tool used to deposit the material, and the desired speed of deposition. The duration of the bombardment can determine the thickness of the electrode. Other processing techniques, such as ALD, PLD, CVD, evaporation, etc. can also be used to deposit the first electrode. In some embodiments, the first electrode is in contact with one of the signal lines 104 or 106. The first electrode may have any thickness, for example 10 Å-2000 Å.

In operation 504, the substrate is heated, for example by heating a pedestal on which the substrate is mounted in an ALD chamber. In this way, a pedestal temperature is maintained for an ALD deposition process so that the metal oxide layer(s) can be deposited. As described further below, the pedestal temperature can be reduced below a pedestal temperature typically used for ALD processes (which may be, for example, 250° C.) to reduce the forming voltage of the resulting memory element. For example, the pedestal on which the substrate is mounted can be heated to and maintained at a temperature of less than 100° C. In one embodiment, the pedestal temperature is maintained throughout the formation of a metal oxide layer using ALD, for example throughout operation 506 (i.e. operations 508-516).

In operation 506, at least one metal oxide layer is formed using ALD. The metal oxide layer can be a resistive-switching metal oxide layer, such as a high bandgap (i.e. greater than 4 eV) material including hafnium oxide, aluminum oxide, yttrium oxide, or tantalum oxide, or can be another resistive-switching material such as titanium oxide. As mentioned above, ALD is a multi-step process used to deposit semiconductor layers. The operation 504 is a single ALD cycle. An ALD-deposited layer typically includes multiple cycles to deposit a layer of a desired thickness, so the process 506 is repeated until the desired layer thickness has been deposited. The metal oxide layer can include single metal oxide (e.g. hafnium oxide or aluminum oxide), can use co-injection or nanolaminates to deposit a binary metal oxide, or can use multiple layers of metal oxides. For example, a hafnium oxide "base" layer can be deposited over a titanium oxide "diffusion barrier" layer. In other embodiments, three or more different layers of materials can be deposited.

In operation 508, a first reagent is introduced to (e.g. flowed onto) a substrate (e.g. over the first electrode) by introducing the first reagent into an ALD chamber. The first reagent can be a metal-containing precursor that is used to form a metal oxide. For example, the first reagent can be trimethylaluminum (TMA) to deposit an aluminum oxide layer or a hafnium oxide layer can be deposited using hafnium precursors such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$). Other precursors, for example tetrakis(ethylmethylamino) zirconium (TEMAZ) to deposit zirconium oxide or tris(methylcyclopentadienyl)-yttrium (($Cp)_3$)Y to deposit yttrium oxide. In other embodiments, lower bandgap (i.e. less than 4 eV) materials, such as titanium oxide, have been shown to exhibit switching properties. Precursors such as tetraisopropoxide (TTIP) can be used to deposit titanium oxide.

In operation 510, the excess (unreacted portion) of the first reagent is purged, for example by purging the ALD chamber to remove excess precursor. The purge duration can be shorter than a typical purge duration for ALD, for example being between 5 and 20 seconds, 10 and 17 seconds, or 15 seconds, compared to a typical purge of 30 seconds. It is believed that the shortened purge duration can leave impurities in the film, creating defects and leading to a lower forming voltage. These impurities are desirable because they can create point defects in the deposited metal oxide layer.

In operation 512, a second reagent is introduced to the substrate. The second reagent combines with the first reagent to form a metal oxide. The second reagent is an oxidizer, for example ozone, water vapor, or oxygen. The second reagent forms an oxide of the metal contained in the first reagent (the precursor). In operation 514, the unreacted second reagent is purged. This purge duration can also be shortened (e.g. to 5-20 seconds or 15 seconds), although a longer purge can also be used.

In operation 516, it is determined whether another ALD deposition cycle is to be performed. A typical ALD cycle may form a layer that is 0.5 Å, for example. To form a 50 Å metal oxide layer, 100 cycles would need to be performed. So, if in operation 516, it is determined that the desired number of cycles has been performed or that the desired thickness has been reached, the process 500 continues to operation 518. If more ALD cycles need to be completed, the process 500 returns to operation 508.

In operation 518, a second electrode is deposited over the metal oxide layer. The second electrode may be, according to some embodiments, a noble or near-noble metal such as iridium, iridium oxide, platinum, ruthenium, or ruthenium oxide deposited using PVD, ALD, CVD, PLD, evaporation, or another suitable technique. A platinum PVD top electrode can be deposited using PVD by sputtering a metal target at 100-500 W with a pressure of 2-10 mTorr for a deposition rate of 0.5-10 Å/s. The duration of the sputtering determines the thickness of the electrode. In other embodiments, a non-noble electrode can be deposited. As mentioned above, it is understood that specifications for performing the deposition depend on the material to be deposited, the desired deposition rate, the tool being used, and other factors.

After the memory element is formed, an initial voltage, the forming voltage, can be applied across the memory element to form the memory element. The forming voltage can be applied by increasing the voltage across the memory element until the memory element switches resistive states. The voltage at which it initially switches is the forming voltage. This forming voltage can be reduced (e.g. to less than 5.5V) as a result of the ALD processing techniques including the lower pedestal temperature and the shorter duration purge described herein.

VI. ALD Processing Techniques

As described above, the metal oxide layer(s) of a memory element 102 can be deposited using ALD. Several ALD processing parameters can be optimized to improve characteristics of memory elements formed using ALD. As described herein, the temperature of the ALD process can be optimized, and the duration of an ALD purge can be optimized. The optimization of these parameters can result in lower forming voltages and increased site yield as well as other advantageous results.

Although certain temperatures, temperature ranges, times, time ranges, materials, material systems, and memory element structures are discussed below, it is understood that the techniques described herein can be used with any memory element described herein as well as with any processing variables (e.g., any temperature or any purge duration).

In one embodiment, for example, a resistive-switching memory element can be made using a titanium nitride electrode, an aluminum oxide resistive-switching metal oxide, and a platinum electrode. In other examples, the memory element can use hafnium oxide as a metal oxide, or doped silicon (e.g. polysilicon) in place of the platinum electrode. In further embodiments, a multi-layered metal oxide stack can be used to form a titanium nitride/titanium oxide/hafnium oxide/platinum memory element. Although these specific examples are given, a memory element using any of the materials described herein or using any other materials can be formed using the techniques described herein.

1. ALD Process Temperature

According to some embodiments, the temperature at which the ALD process is performed can be optimized to lower forming voltage and increase site yield. The optimal temperature can depend on several variables including the metal oxide material(s), electrode materials, memory element structure, memory element thickness, etc. For some embodiments, the optimal temperature may be lower than a standard processing temperature.

i. Process Example

As an example, a memory element (e.g. the memory element 102-4) can be formed using an aluminum oxide layer 402. A typical ALD deposition process may be performed using a pedestal temperature of 250° C. For the deposition of aluminum oxide, the pedestal temperature can be lowered to, for example, approximately 80° C. (or in the range of 50-100° C., in the range of 70-90° C., less than 200° C., less than 100° C., etc.). It is understood that any temperature can be used as appropriate. The pedestal can be heated to heat the substrate, as is described in operation 504 of the process 500.

Without being bound by theory, a metal oxide (e.g. aluminum oxide) deposited using a lower pedestal temperature may include more carbon and hydrogen impurities than aluminum oxide deposited using a higher pedestal temperature. The carbon and hydrogen atoms passivate traps in the metal oxide, which results in a reduction in the number of active traps to be filled. The fewer traps require a lower voltage to form the memory element, thereby reducing the forming voltage. The lower forming voltage is desirable to reduce potential damage to the memory element. The lower pedestal temperature should therefore reduce forming voltage regardless of the material being deposited or the precursor being used.

ii. Experimental Data

Figure 6A:
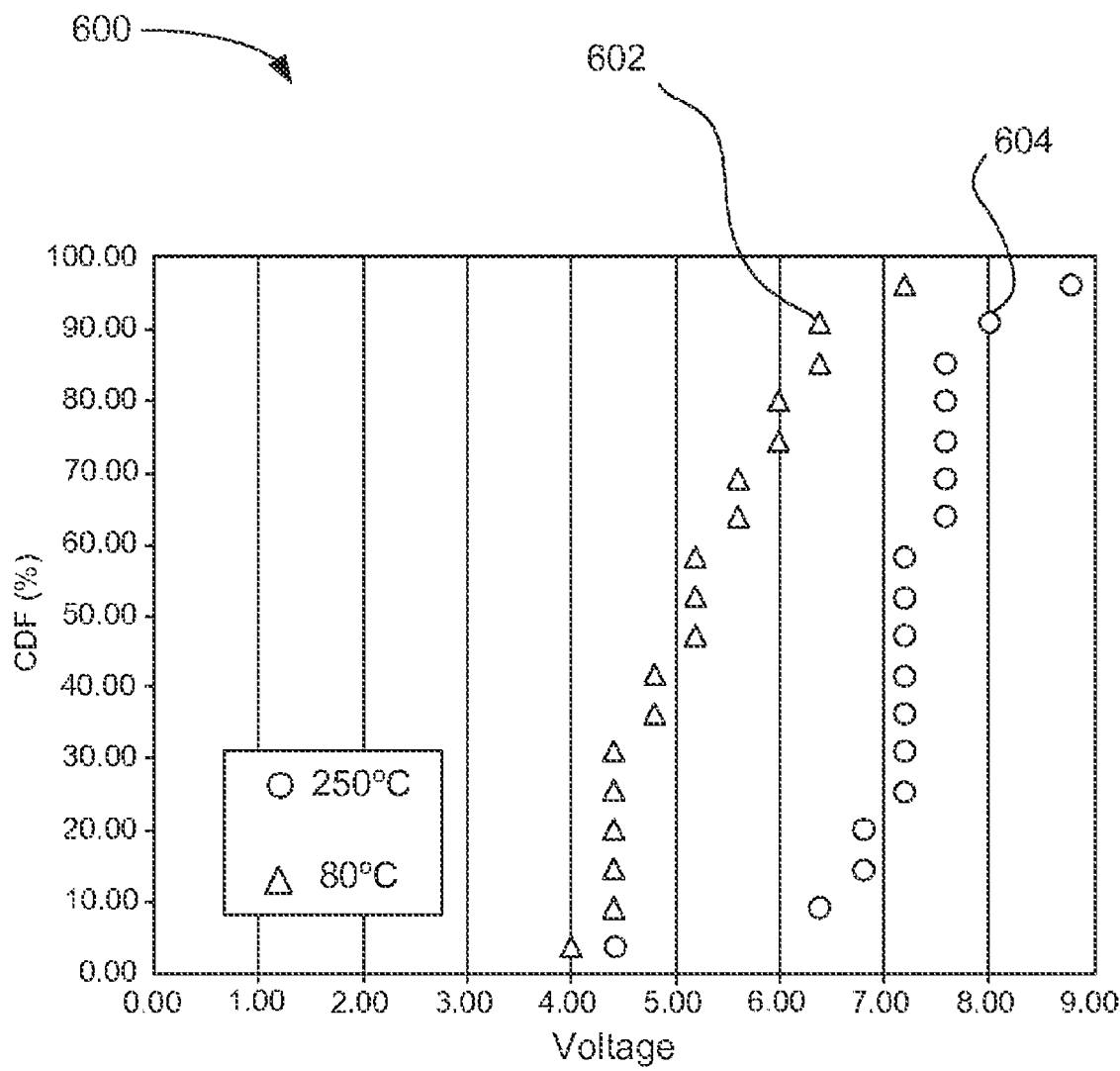
FIG. 6A is a distribution plot illustrating forming voltages for memory elements formed using varying ALD pedestal temperatures.

FIG. 6A is a distribution plots 600 illustrating forming voltages for memory elements formed using varying ALD pedestal temperatures. The memory elements include an approximately 50 Å thick aluminum oxide layer between a titanium nitride electrode and a platinum electrode. The aluminum oxide layer was deposited using a trimethylaluminum precursor and ozone.

The ALD pedestal temperature for forming one set of memory elements 602 was 80° C., and the pedestal temperature for another set of memory elements 604 was 250° C. The memory elements 602 formed using the lower ALD pedestal temperature have a lower median forming voltage of 5.2V versus a median forming voltage of 7.2V for the memory elements 604. Therefore, the median forming voltage can be reduced to less than 5.5V, for example. Accordingly, optimizing the ALD pedestal temperature can reduce the forming voltage of the resulting memory element.

Figure 6B:
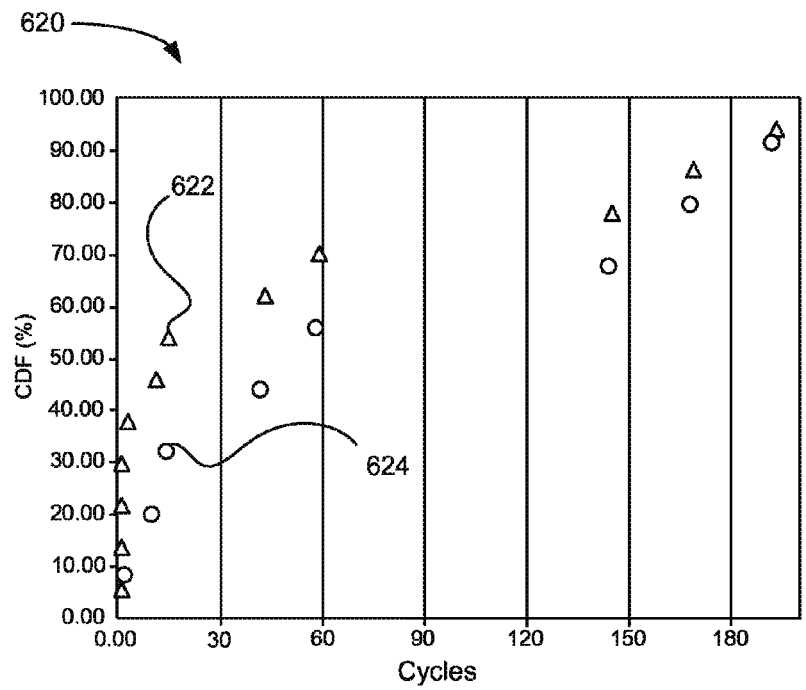
FIGS. 6B and 6C are distribution plots showing site yield of memory elements formed using ALD at different pedestal temperatures.
Figure 6C:
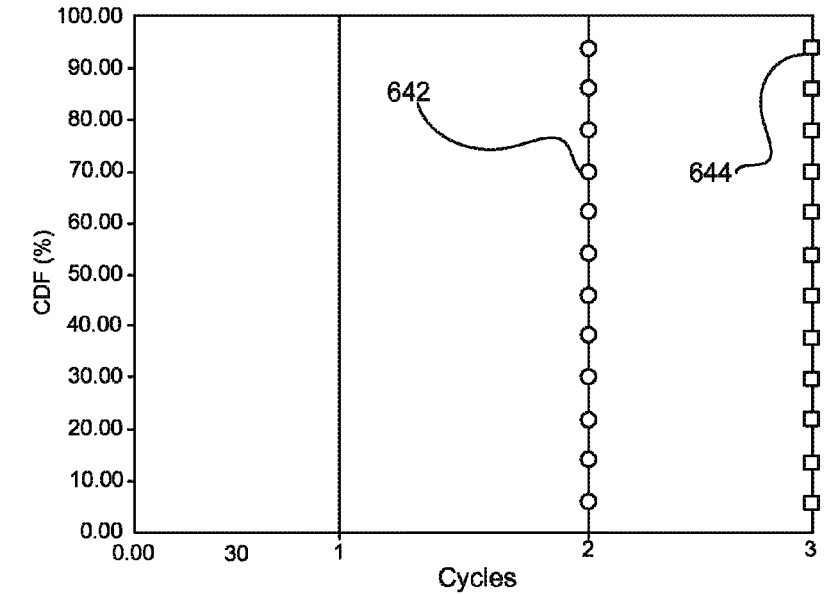

FIGS. 6B and 6C are distribution plots 620 and 640 showing site yield of memory elements formed using ALD at different pedestal temperatures. The plot 620 in FIG. 6B shows the survival of an ALD aluminum oxide layer between a titanium nitride electrode and a platinum electrode, where the pedestal temperature was 80° C. The plot 640 in FIG. 6C shows the survival of an ALD aluminum oxide layer between a titanium nitride electrode and a platinum electrode, where the pedestal temperature was 250° C.

The plots 620 and 640 show the number of memory elements that have failed (i.e. no longer switch) by a certain cycle number. The y-axis plots the percentage of memory elements that have failed, while the x-axis plots the cycle number. The plot 620 shows a set of memory elements 622 (represented by triangles) and a set of memory elements 624 (represented by circles) that were both deposited using a pedestal temperature of 80° C. In the set of memory elements 624, for example, more than 50% of the memory elements are still switching after 30 set and reset cycles, and in both sets 622 and 624, at least half of the memory elements survive to 10 cycles.

The plot 640 includes a set of memory elements 642 (represented by circles) and a set of memory elements 644 (represented by squares) that were both deposited using a pedestal temperature of 250° C. As can be seen, the memory elements 642 only last to two cycles and the memory elements 644 only last to three cycles.

The devices formed at the lower temperature (as shown in the plot 620) survive many more switching cycles. As a result, the pedestal temperature is optimized by lowering the temperature, for example to beneath 100° C., to between 70 and 90° C., or to 80° C.

2. ALD Purge Duration

Some ALD processes use a cycle for depositing a monolayer. For example, the cycle can include four steps: 1) introduce a first reagent, 2) purge the excess of the first reagent, 3) introduce a second reagent, and 4) purge the excess of the second reagent. In some embodiments, optimizing the time of the purge portions of an ALD cycle can reduce forming voltage of resulting memory elements.

i. Process Example

As an example, a memory element of the type of the memory element 102-4 can be formed using an aluminum oxide layer 402. A typical ALD deposition process may be performed using a purge time of 30 seconds. For the deposition of aluminum oxide, the purge time can be reduced to, for example, approximately 15 seconds (or less than 20 seconds, or in the range of 5-20 seconds, in the range of 10-17 seconds, etc.).

Without being bound by theory, and as described above, increased impurities can passivate traps in the deposited metal oxide. Shortening the purge duration can increase the number of impurities in the deposited film because less purge time results in fewer impurities being removed, thereby reducing the amount of voltage needed to form the memory elements. The shortened pulse duration should therefore reduce forming voltage regardless of the material being deposited or the precursor being used.

ii. Experimental Data

Figure 6D:
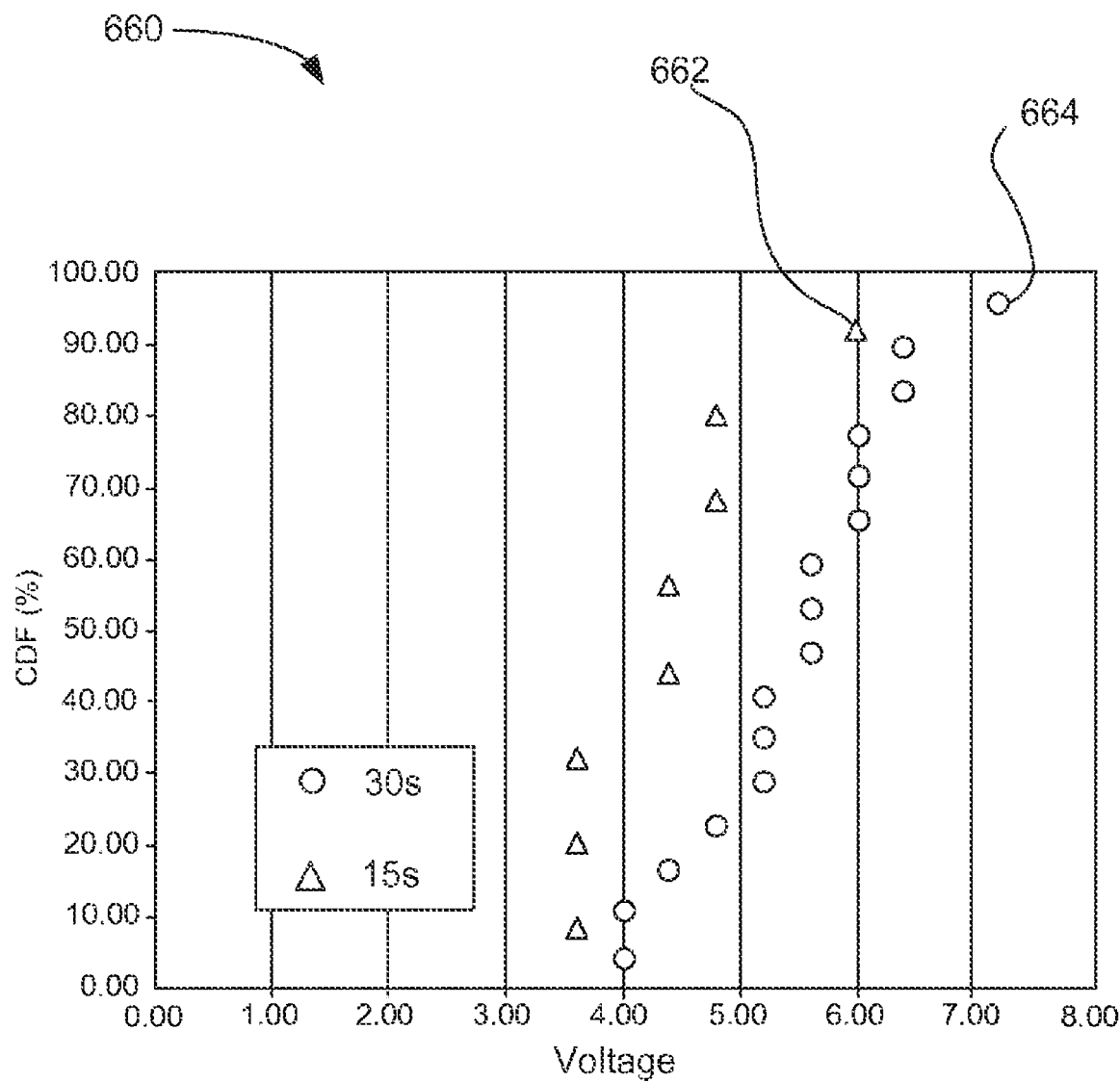
FIG. 6D is a distribution plot of memory elements formed from ALD processes using different purge durations.

FIG. 6D is a distribution plot 660 of memory elements formed from ALD processes using different purge durations. The memory elements include an aluminum oxide layer between a titanium nitride electrode and a platinum electrode. The aluminum oxide layer is approximately 50 Å and formed using ALD. The memory elements 662 (represented by triangles) were formed using a 15 second purge, while the memory elements 664 (represented by circles) were formed using a 30 second purge. The aluminum oxide layer was deposited using a trimethylaluminum precursor and ozone.

The median forming voltage of the memory elements 662 formed using the 15 second purge is 4.4V, while the median forming voltage of the memory elements 664 formed using the 30 second purge is 5.6V. Therefore, for these memory elements, forming voltage is reduced and the purge duration is optimized by shortening the purge duration. Therefore, by shortening the purge duration, the median forming voltage can be reduced to less than 5.5V or less than 5V.

Although certain operational mechanisms are described herein, it is understood that the various embodiments are not bound by the theories of these operational mechanisms. Further, although the foregoing examples have been described in some detail for purposes of clarity of understanding, the invention is not limited to the details provided. There are many alternative ways of implementing the invention. The disclosed examples are illustrative and not restrictive.

What is claimed is:

1. A stack comprising:
   a first electrode;
   a resistive-switching metal oxide layer; and
   a second electrode,
   the resistive-switching metal oxide layer disposed between the first electrode and the second electrode,
   the resistive-switching metal oxide layer comprising a first metal oxide and a second metal oxide,
   the first metal oxide being different from the second metal oxide,
   the first metal oxide comprising one of hafnium oxide, aluminum oxide, titanium oxide, tantalum oxide, zirconium oxide, yttrium oxide, dopant variants thereof, or combinations thereof.

2. The stack of claim 1, wherein the second metal oxide comprises one of hafnium oxide, aluminum oxide, titanium oxide, tantalum oxide, zirconium oxide, yttrium oxide, dopant variants thereof, or combinations thereof.

3. The stack of claim 1, wherein the first metal oxide comprises hafnium oxide, and wherein the second metal oxide comprises titanium oxide.

4. The stack of claim 1, wherein the first metal oxide comprises aluminum oxide, and wherein the second metal oxide comprises titanium oxide.

5. The stack of claim 1, wherein the resistive-switching metal oxide layer further comprises a dopant, the dopant comprising one of scandium oxide, yttrium oxide, or nickel oxide.

6. The stack of claim 1, wherein the first electrode interfaces the resistive-switching metal oxide layer and comprises titanium, and wherein the first metal oxide comprises titanium oxide.

7. The stack of claim 6, wherein the first electrode comprises titanium nitride.

8. The stack of claim 1, wherein the resistive-switching metal oxide layer comprises a first sub-layer and a second sub-layer, the first sub-layer comprising the first metal oxide, and the second sub-layer comprising the second metal oxide, the first sub-layer and the second sub-layer form a stack between the first electrode and the second electrode.

9. The stack of claim 8, wherein the first sub-layer and the second sub-layer form a nanolaminate.

10. The stack of claim 8, wherein the first sub-layer is substantially free from the second metal oxide, and wherein the second sub-layer is substantially free from the first metal oxide.

11. The stack of claim 1, wherein the second metal oxide comprises a ternary metal oxide.

12. The stack of claim 1, further comprising a current steering element, the current steering element is connected in series with the resistive switching layer.

13. The stack of claim 12, wherein the current steering element is disposed between the first electrode and the resistive switching layer.

14. The stack of claim 12, wherein the current steering element is one of a diode or a transistor.

15. The stack of claim 1, wherein the first electrode and the second electrode each comprises one of doped silicon, platinum, titanium nitride, iridium, iridium oxide, ruthenium, or ruthenium oxide.

16. The stack of claim 1, wherein the resistive-switching metal oxide layer has a thickness of between about 50 Angstroms and 300 Angstroms.

17. The stack of claim 1, wherein the first electrode comprises titanium nitride, wherein the first metal oxide comprises titanium oxide, wherein the second metal oxide comprises hafnium oxide, and wherein the second electrode comprises platinum.

18. The stack of claim 1, wherein the second metal oxide has a bandgap of at least about 4 eV.

19. The stack of claim 1, wherein the resistive-switching metal oxide layer comprises defects creating localized charge variances operable to be filled and emptied when switching voltage pulses applied between the first electrode and the second electrode.

* * * * *